United States Patent
Choi et al.

(10) Patent No.: US 9,482,810 B2
(45) Date of Patent: Nov. 1, 2016

(54) CIRCUIT BOARD AND LIGHTING DEVICE HAVING THE CIRCUIT BOARD

(71) Applicant: LG INNOTEK CO., LTD., Seoul (KR)

(72) Inventors: Man Hue Choi, Seoul (KR); Min Jae Kim, Seoul (KR); Bi Yi Kim, Seoul (KR); Se Woong Na, Seoul (KR); Hyun Gyu Park, Seoul (KR); In Hee Cho, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/314,920

(22) Filed: Jun. 25, 2014

(65) Prior Publication Data

US 2015/0003064 A1 Jan. 1, 2015

(30) Foreign Application Priority Data

Jun. 28, 2013 (KR) .................. 10-2013-0075343

(51) Int. Cl.
*F21V 23/00* (2015.01)
*F21V 29/00* (2015.01)
*F21V 8/00* (2006.01)
*H05K 1/02* (2006.01)
*G02F 1/1335* (2006.01)

(52) U.S. Cl.
CPC ........... *G02B 6/0083* (2013.01); *H05K 1/0284* (2013.01); *G02B 6/009* (2013.01); *G02B 6/0068* (2013.01); *G02B 6/0073* (2013.01); *G02F 1/133615* (2013.01); *G02F 2001/133612* (2013.01); *H05K 2201/09063* (2013.01); *H05K 2201/0999* (2013.01); *H05K 2201/10106* (2013.01); *H05K 2201/10136* (2013.01); *H05K 2201/10189* (2013.01)

(58) Field of Classification Search
CPC ........... G02F 1/133615; F21V 23/004; F21V 23/005; F21V 19/003; G02B 6/0083
See application file for complete search history.

(56) References Cited

U.S. PATENT DOCUMENTS

| 8,475,031 | B1* | 7/2013 | Chen | G02B 6/009 |
| | | | | 362/600 |
| 8,724,049 | B2* | 5/2014 | Jeong | G02B 6/0068 |
| | | | | 349/58 |
| 2007/0041166 | A1 | 2/2007 | Lin | |
| 2010/0128194 | A1* | 5/2010 | Cho | G02F 1/133615 |
| | | | | 349/58 |
| 2012/0051069 | A1 | 3/2012 | Lim | |
| 2012/0248961 | A1* | 10/2012 | Lai | F21V 29/004 |
| | | | | 313/46 |
| 2012/0250290 | A1* | 10/2012 | Park | G02F 1/133615 |
| | | | | 362/97.1 |
| 2013/0077026 | A1* | 3/2013 | Seo | G02B 6/0083 |
| | | | | 362/382 |
| 2014/0198530 | A1* | 7/2014 | Hong | G02B 6/0091 |
| | | | | 362/382 |

FOREIGN PATENT DOCUMENTS

| JP | 2002-151825 A | 5/2002 |
| JP | 2004-087261 A | 3/2004 |
| JP | 2011-023227 A | 2/2011 |
| JP | 2011-035068 A | 2/2011 |
| JP | 2012-234724 A | 11/2012 |
| KR | 10-1330774 B1 | 11/2013 |
| WO | WO-2011/004680 A1 | 1/2011 |
| WO | WO-2011/086760 A1 | 7/2011 |
| WO | WO-2012/166440 A1 | 12/2012 |

* cited by examiner

*Primary Examiner* — Mariceli Santiago
(74) *Attorney, Agent, or Firm* — Saliwanchik, Lloyd & Eisenschenk

(57) ABSTRACT

Provided is a circuit board including: a supporting substrate; light emitting elements mounted to the supporting substrate; a through hole passing through the supporting substrate; and a connector inserted into the through hole and for supplying an electric current to the light emitting elements.

7 Claims, 4 Drawing Sheets

(510)

(520)

(530)

(540)

CIRCUIT BOARD AND LIGHTING DEVICE HAVING THE CIRCUIT BOARD

CROSS-REFERENCE TO RELATED APPLICATION

This application claims the benefit under 35 U.S.C. §119 of Korean Patent Application No. 10-2013-0075343, filed Jun. 28, 2013, which is hereby incorporated by reference in its entirety.

BACKGROUND

1. Field of the Invention

Embodiments of the present invention relate to a circuit board and a lighting device having the circuit board.

2. Description of the Related Arts

A liquid crystal display (LCD) has no self-luminous which can make its own light, a separate lighting device is needed for all the liquid crystal display devices. Such a lighting device serves as a light source of the liquid crystal display device, and a backlight unit (BLU) refers to a complex composed of a light source itself for irradiating light to a rear surface of a liquid module, a power circuit for driving the light source, and all components for enabling uniform flat light to be formed.

The liquid crystal display device becomes gradually thin, and accordingly, a reduction in a bezel width of the liquid crystal display device has been needed. As one example, in order to reduce the bezel width, the structure of a circuit board on which light emitting devices are mounted, or the structure of a lighting device including a light guide plate for guiding light generated from the light emitting devices has been changed.

However, even though the structure of the circuit board becomes thin, the shape of a connector for providing an electric current to the light emitting elements has not been changed, and thus it is problematic in that it is difficult to reduce the bezel width due to the connector.

Accordingly, ways to mount the connector to the circuit board have been practically needed.

BRIEF SUMMARY

An aspect of embodiments of the present invention may provide a circuit board which is configured such that a through hole is formed in one region of a supporting substrate so that a connector can be inserted into the through hole, thereby enabling a space occupied by the connector to be reduced.

Another aspect of embodiments of the present invention may provide a circuit board which is configured such that a through hole is formed at a position corresponding to a spaced portion between the light emitting elements in a supporting substrate so that a connector can be mounted to a region to which the light emitting elements are mounted, thereby enabling a width of the supporting substrate to be reduced.

A further aspect of embodiments of the present invention may provide a circuit board which is configured such that a through hole is formed in at least one of a first region and a second region of a supporting substrate including the first region and the second region extending to be bent from the first region so that a connector can be inserted into the through hole, thereby enabling a width of the circuit board to be reduced to the extent of a width occupied by the connector.

Yet another aspect of embodiments of the present invention may provide a lighting device which is configured such that an external through hole is formed in an outer housing to correspond to a through hole of a circuit board so that a connector can be inserted into the external through hole of the outer housing, thereby enabling a width for insertion of the connector to be reduced, and thus when the circuit board is applied to the display device, a bezel width of a display device can be reduced.

According to an aspect of the embodiments of the present invention, a circuit board may include: a supporting substrate; light emitting elements mounted to the supporting substrate; a through hole passing through the supporting substrate; and a connector inserted into the through hole and for supplying an electric current to the light emitting elements.

The light emitting elements may be plural in number, and the through hole may be formed at a position corresponding to a spaced portion between the light emitting elements.

The through hole may be formed at a position corresponding to a lower side of the light emitting elements.

The supporting substrate may include a first region and a second region extending to be bent from the first region, and the through hole may be formed in at least one of the first region and the second region.

The light emitting elements may be mounted to one surface of the first region of the supporting substrate, and the circuit board may further include a pad portion having pad wirings connected to the light emitting elements on one surface of the first region; and a string portion having string wirings for transmitting electrical signals to the light emitting elements in the first region or the second region.

The circuit board may further include a bending hole formed in a bending portion between the first region and the second region.

The connector may be mounted to the second region, and the string portion has the string wirings formed on another surface opposite to the one surface of the first region so as to be connected to the pad wirings through the bending hole.

According to another aspect of the embodiments of the present invention, a lighting device may include: the aforesaid circuit board and an outer housing including an external through hole corresponding to a through hole of the circuit board.

Meanwhile, according to further aspect of the embodiments of the present invention, a circuit board may include: a supporting substrate; light emitting elements mounted to the supporting substrate; and a through hole through which the supporting substrate passes, and into which a connector for supplying currents to the light emitting elements is inserted.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
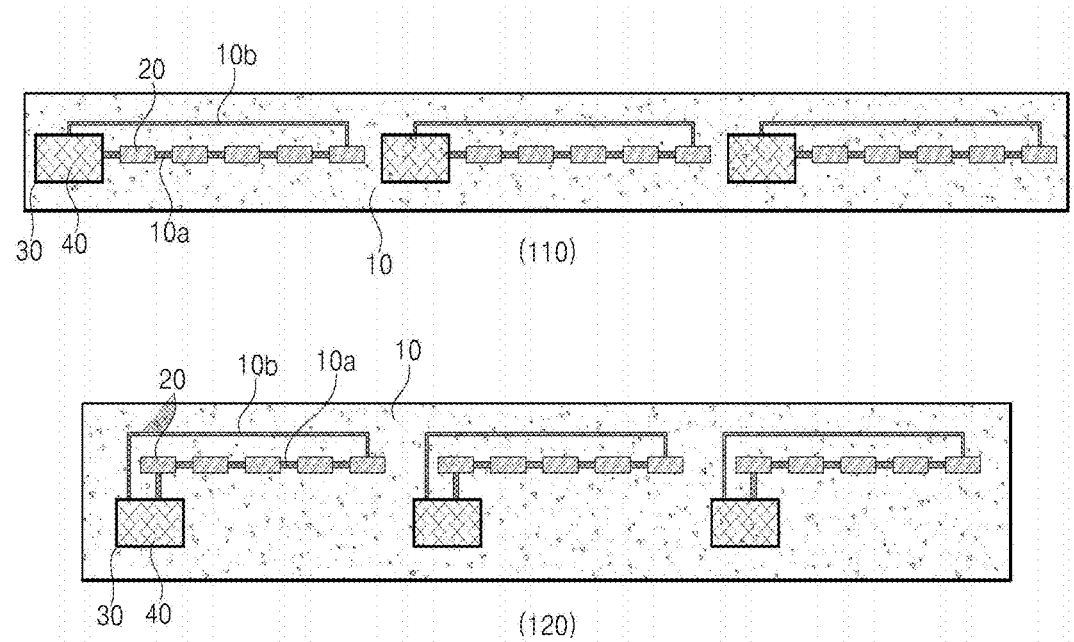
FIG. 1 is a view illustrating circuit boards according to an embodiment of the present invention.

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

FIG. 1 is a view illustrating circuit boards according to an embodiment of the present invention.

Referring to FIG. 1, each of circuit boards 110, 120 include: a supporting substrate 10; light emitting elements 10 mounted to the supporting substrate 10; a through hole 30 passing through the supporting substrate 10; and a connector 40 inserted into the through hole 30 and for supplying an electric current to the light emitting elements 20.

Each of the circuit boards may be formed in a bar-like shape or a bending shape divided into a first region A and a second region B according to some embodiment. In FIG. 1, the circuit boards in a bar-like shape are explained as an example.

According to one embodiment, the circuit board 110 has a structure in which the through hole 30 is formed at a position corresponding to a spaced portion between the light emitting elements 20 so that the connector 40 is inserted into the through hole 30.

According to another embodiment, a circuit board 120 has a structure in which the though hole 30 is formed at a position corresponding to a lower side of the light emitting elements 20 so that the connector 40 is inserted into the through hole 30.

At this time, each of the circuit boards 110, 120 needs wirings for connecting the light emitting elements 20 and the connector 40. That is, the circuit board 110 may further include: a pad portion having pad wirings 10a connected to the light emitting elements 20; and a string portion having string wirings 10b connected to the pad wirings 10a and for transmitting electrical signals to the light emitting elements 20.

Accordingly, the circuit board according to the present embodiment may enable a space occupied by the connector to be reduced because the connector is inserted into the through hole of the supporting substrate, thereby enabling the bezel width of a display device to be reduced to the extent of a width occupied by the connector when the circuit board is mounted to the display device.

Figure 2:
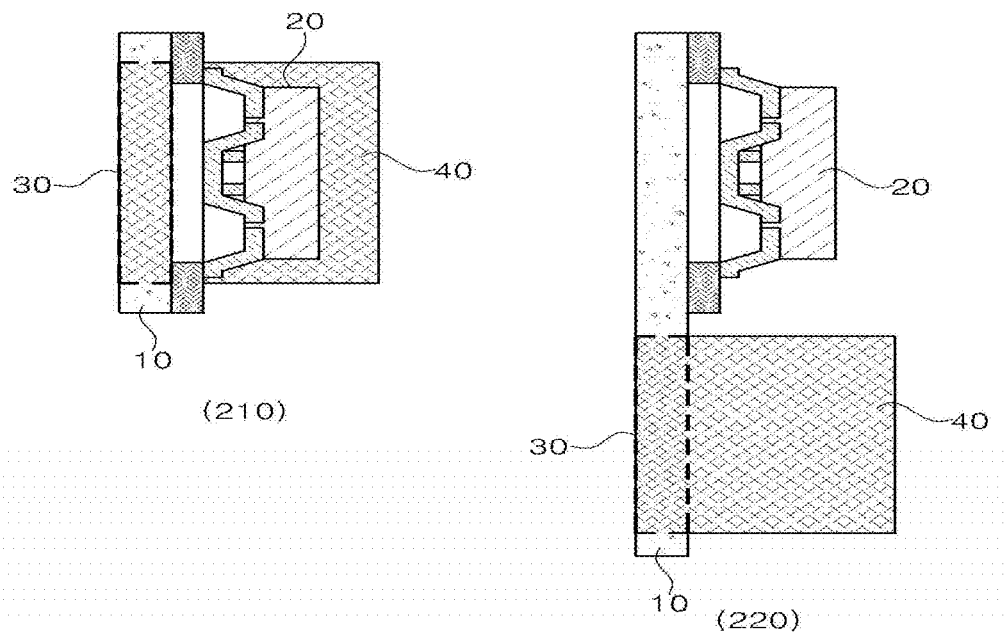
FIG. 2 is a view illustration a cross section of each of the circuit boards of FIG. 1.

FIG. 2 is a view illustrating a cross section of each of the circuit boards of FIG. 1.

Referring to FIG. 2, a circuit board 210 has a structure in which the though hole 30 is formed at a position corresponding to a spaced portion between the light emitting elements 20 so that the connector 40 is inserted into the through hole 30. Also, a circuit board 220 has a structure in which the though hole 30 is formed at a position corresponding to a lower side of the light emitting elements 20 so that the connector 40 is inserted into the through hole 30.

That is, the circuit board according to the present embodiment may allow a reduction in a thickness of the connector 40 to the extent of a thickness occupied by the supporting substrate 10.

Figure 3:
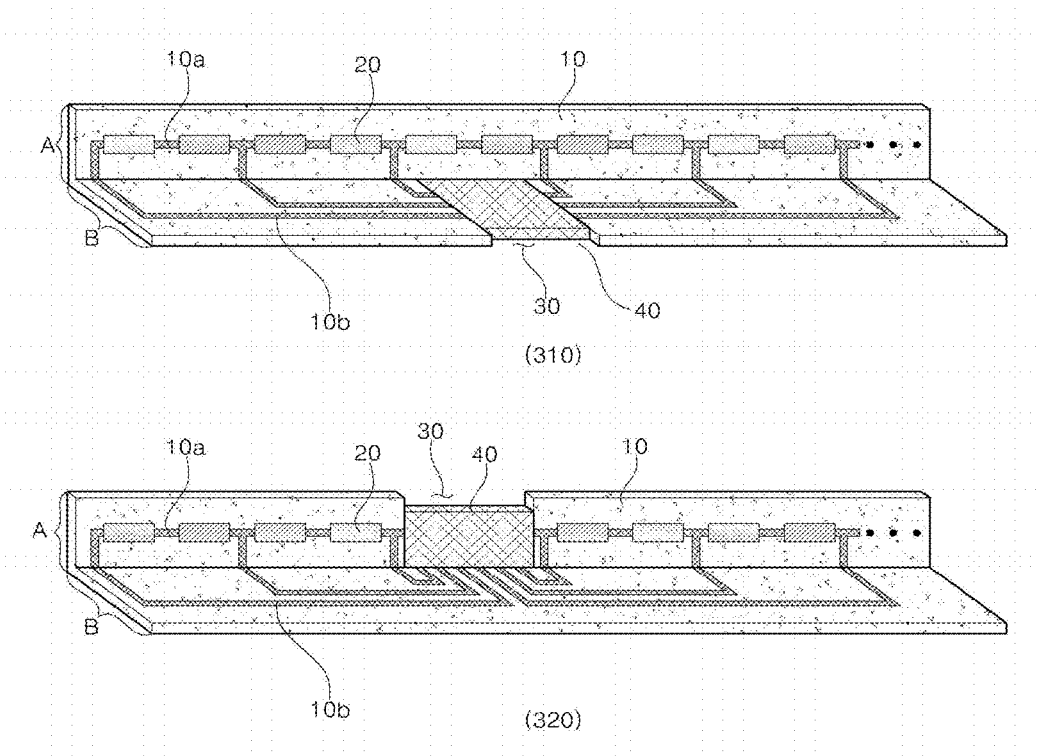
FIG. 3 is a view illustrating circuit boards according to another embodiment of the present invention.

FIG. 3 is a view illustrating circuit boards according to another embodiment of the present invention.

Referring to FIG. 3, each of circuit boards 310, 320 includes: the supporting substrate 10 having the first region A and the second region B extending to be bent from the first region A; the light emitting elements 20 mounted to the supporting substrate 10; the through hole 30 passing through the supporting substrate 10; and the connector 40 inserted into the through hole 30 and for supplying currents to the light emitting elements 20. In FIG. 3, the circuit boards having a bending type structure are explained as an example.

The light emitting elements 20 may be mounted to one surface of the first region A. Also, the through hole 30 may be formed in the first region A or the second region B of the supporting substrate 10.

According to one embodiment, the circuit board 310 has a structure in which the light emitting elements 20 are mounted to the one surface of the first region A, and the through hole 30 is formed in the second region B so that the connector 40 is inserted into the through hole 30. Also, the circuit board 310 may further include: the pad portion having the pad wirings 10a connected to the light emitting elements 20 on one surface of the first region A; and the string portion having the string wirings 10b connected to the pad wirings 10a and for transmitting electrical signals to the light emitting elements 20. In the present drawing, it is illustrated that the string portion is formed in the second region B, but the string portion may be formed on another surface opposite to the one surface of the first region A.

According to another embodiment, the circuit board 320 has a structure in which the light emitting elements 20 are mounted to one surface of the first region A, and the through hole is formed in a spaced portion between the light emitting elements so that the connector 40 is inserted into the through hole 30. Also, the circuit board 320 may further include: the pad portion having the pad wirings 10a connected to the light emitting elements 20 on one surface of the first region A; and the string portion having the string wirings 10b connected to the pad wirings 10a and for transmitting electrical signals to the light emitting elements. In the present drawing, even though it is illustrated that the string portion is formed in the second region B, the string portion may be formed on another surface opposite to the one surface of the first region A.

Also, each of the circuit boards 310, 320 may further include a bending portion between the first region A and the second region B even though this is not illustrated in the drawing.

Figure 4:
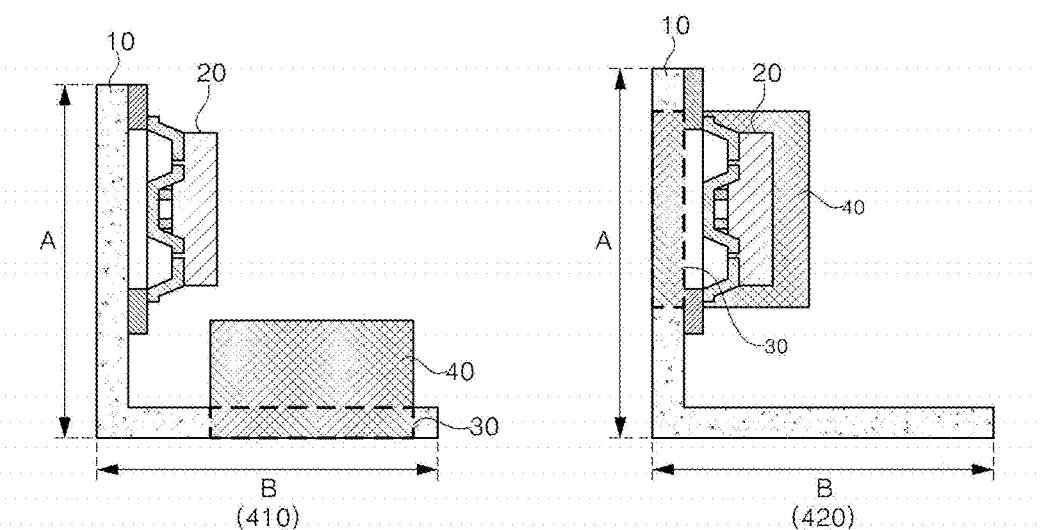
FIG. 4 is a view illustrating a cross section of each of the circuit boards of FIG. 3.

FIG. 4 is a view illustrating a cross section of each of the circuit boards of FIG. 3.

Referring to FIG. 4, a circuit board 410 may have a structure in which the light emitting elements 20 are mounted to one surface of the first region A, and the through hole 30 is formed in the second region B so that the connector 40 is inserted into the through hole 30. Also, a circuit board 420 may have a structure in which the light emitting elements 20 are mounted to one surface of the first region A, and the through hole 30 is formed in a spaced portion between the light emitting elements of the first region A so that the connector 40 is inserted into the through hole 30.

Accordingly, according to the present embodiment of the invention, the through hole is formed in at least one of the first region and the second region of the supporting substrate having the first region and the second region extending to be bent from the first region so that the connector is inserted into the through hole, thereby enabling a width of the circuit board to be reduced to the extent of a width occupied by the connector.

Figure 5:
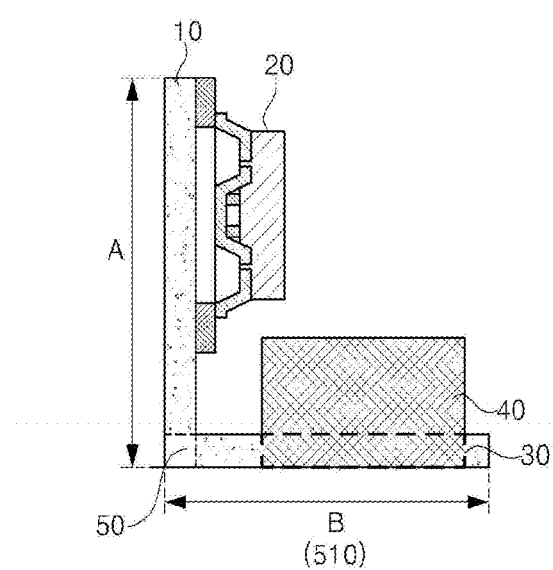
FIG. 5 is a view illustrating a cross section of each of circuit boards according to a further embodiment of the present invention.
Figure 5:
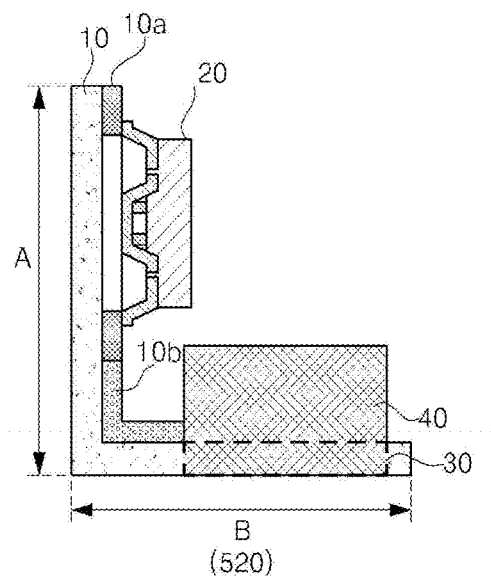
Figure 5:
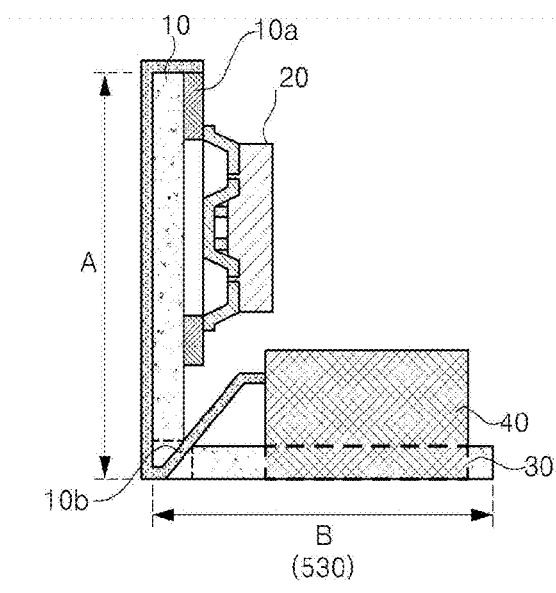
Figure 5:
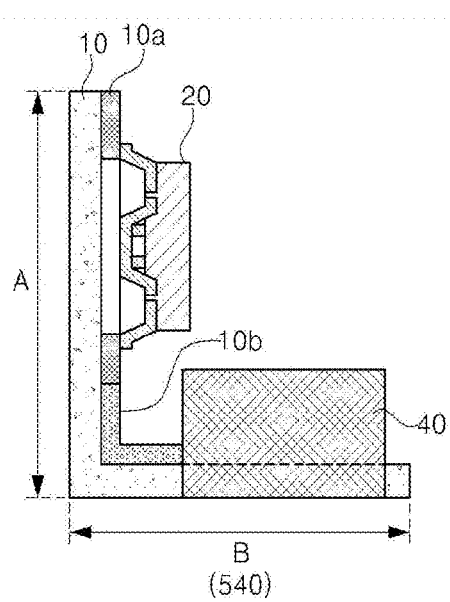

FIG. 5 is a view illustrating a cross section of each of circuit boards according to a further embodiment of the present invention.

Referring to FIG. 5, a circuit board 510 may have a structure in which the light emitting elements 20 are mounted to one surface of the first region A, and the through hole 30 is formed in the second region B so that the connector is inserted into the through hole 30, wherein a bending hole 50 may be formed in a bending portion between the first region A and the second region B.

Also, a circuit board 520 may have a structure in which the light emitting elements 20 are mounted to one surface of the first region A; the pad portion has the pad wirings 10a connected to the light emitting elements on the one surface of the first region A; the string portion has the string wirings 10b connected to the pad wirings 10a and for transmitting electrical signals to the light emitting elements on the one surface of the first region A; and the though hole 30 is formed in the second region B so that the through hole is inserted into the connector 40.

Also, a circuit board 530 may have a structure in which the light emitting elements 20 are mounted to one surface of the first region A; the through hole 30 is formed in the second region B; the connector 40 is inserted into the through hole 30; the bending hole 50 is formed in a bending portion between the first region A and the second region B; the pad wirings 10a connected to the light emitting elements 20 are formed on the one surface of the first region A; and the string wirings 10b transmitting electrical signals to the light emitting elements 20 are formed on another surface opposite to the one surface of the first region A. At this time, the pad wirings 10a and the string wirings 10b may be connected through an upper side of the first region A in which the one surface and the other surface meet. Also, the string wirings 10b may be connected to the connector 40 via the bending hole 50.

A circuit board 540 may have a structure in which the light emitting elements are mounted to one surface of the first region A; the through hole 30 is formed in the second region B; the connector 40 is inserted into the through hole 30; the pad wirings 10a connected to the light emitting elements 20 are formed on the one surface of the first region A; and the string wirings 10b connected to the pad wirings to transmit electrical signals to the light emitting elements are formed in the second region B.

Figure 6:
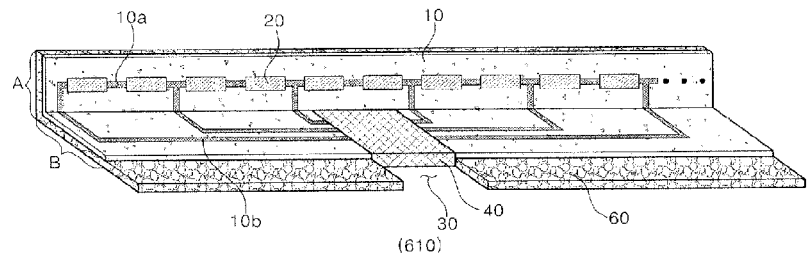
FIG. 6 is a view illustrating lighting devices according to one embodiment of the present invention.
Figure 6:
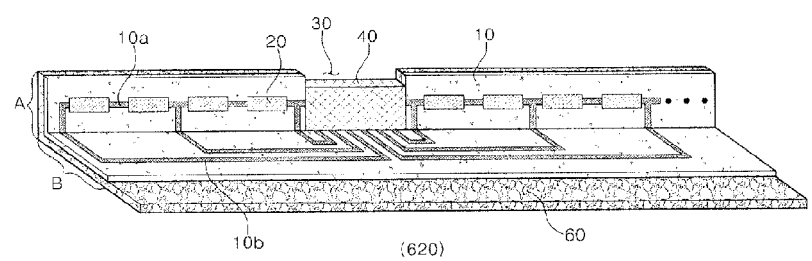

FIG. 6 is a view illustrating lighting devices according to an embodiment of the present invention.

Referring to FIG. 6, each of lighting devices 610, 620 includes: a circuit board including the supporting substrate 10 having the first region A and the second region B extending to be bent from the first region A, the light emitting elements 20 mounted to one surface of the first region A, and the through hole 30 which the supporting substrate 10 passes through, and into which the connector 40 for supplying an electric current to the light emitting elements is inserted; and an outer housing 60 including an external through hole corresponding to the through hole 30 of the circuit board.

The lighting device 610 has a structure in which the light emitting elements 20 are mounted to one surface of the first region A; the through hole 30 is formed in the second region B; and an external through hole is formed in the outer housing 60 located at a position corresponding to the through hole 30. The outer housing 60 serves as a support for supporting the circuit board when the circuit board is mounted to the display device. Since a thickness of the connector 40 is larger than that of the supporting substrate 10, when the connector is mounted to the display device, the external through hole is also formed in the outer housing 60 mounted along with the connector, so a thickness resulting from mounting the connector 40 can be reduced to the extent of a thickness of the supporting substrate 10 and a thickness of the outer housing 60.

Also, the lighting device 620 has a structure in which the light emitting elements are mounted to one surface of the first region A; the through hole 30 is formed in a spaced portion between the light emitting elements 20 of the first region A; and the external through hole is formed in the outer housing 60 of the position corresponding to the through hole 30.

Accordingly, when the lighting device of the present invention is applied to the display device, a space occupied by the connector can be reduced to the extent of the thickness of each of the supporting substrate and the outer housing, and as a result, a bezel width of the display device can be reduced.

Figure 7:
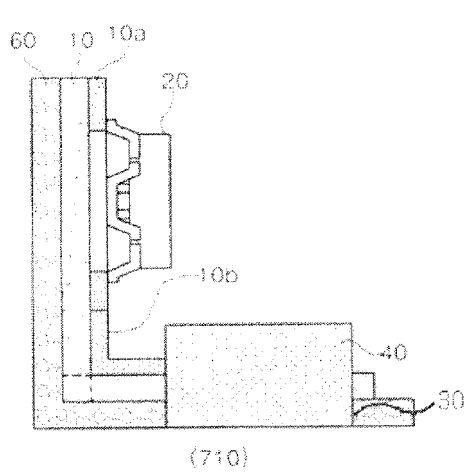
FIG. 7 is a view illustrating a cross section of each of the lighting devices of FIG. 6.
Figure 7:
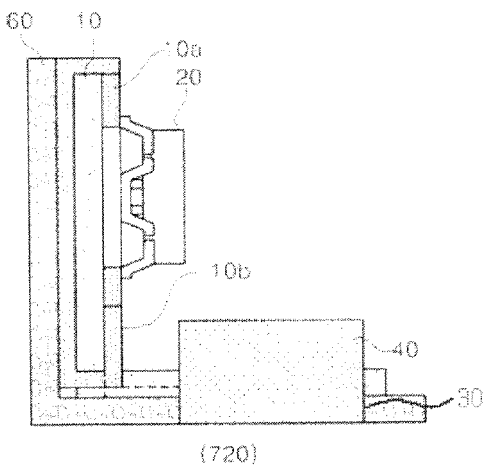

FIG. 7 is a view illustrating a cross section of the lighting device of FIG. 6.

Referring to FIG. 7, a lighting device 710 may include: the circuit board which is configured such that the light emitting elements 20 are mounted to one surface of the first region A, the through hole 30 is formed in the second region B, the connector 40 is inserted into the through hole; and the outer housing 60 in which the external through hole is formed at a position corresponding to the through hole 30, wherein the bending hole 50 may be formed in the bending portion between the first region A and the second region B. The circuit board may further include: a pad portion having the pad wirings 10a connected to the light emitting elements 20 on the one surface of the first region A; and a string portion having the string wirings 10b connected to the pad wirings 10a of the second region B to transmit electrical signals to the light emitting elements 20.

Also, a lighting device 720 may include: the circuit board which is configured such that the light emitting elements 20 are mounted to one surface of the first region A, the through hole 30 is formed in the second region B, and the connector 40 is inserted into the through hole 30; and the outer housing 60 in which the external through hole is formed at a position corresponding to the through hole 30, wherein the bending hole 50 is formed in a bending portion between the first region A and the second region B, the pad wirings 10a connected to the light emitting elements 20 are formed on the one surface of the first region A, and the string wirings 10b for transmitting electrical signals to the light emitting elements are formed on another surface opposite to the one surface of the first region A. At this time, the pad wirings 10a and the string wirings 10b may be connected through an upper side of the first region A in which the one surface and the other surface meet. Also, the string wirings 10*b* may be connected to the connector 40 through the bending hole 50.

As set forth above, according to one embodiment of the present invention, the through hole passing through one region of the supporting substrate is formed so that the connector is inserted into the through hole, thereby enabling a space occupied by the connector to be reduced.

According to one embodiment of the present invention, the through hole is formed at the position corresponding to the spaced portion between the light emitting elements of the supporting substrate so that the connector is mounted to a region to which the light emitting elements are mounted, thereby enabling a width of the supporting substrate to be reduced.

According to one embodiment of the present invention, the through hole is formed in at least one of the first region and the second region of the supporting substrate including the first region and the second region extending to be bent from the first region so that the connector is inserted into the through hole, thereby enabling the width of the circuit board to be reduced to the extent of the width occupied by the connector.

According to one embodiment of the present invention, the external through hole is formed in the outer housing to correspond to the through hole of the circuit board so that the connector is inserted into the through hole of the circuit board and the external through hole of the outer housing, thereby enabling a width into which the connector is inserted to be reduced. Thus, it can be provided with the lighting device capable of reducing the bezel width of the display device when the circuit board is applied to the display device.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A circuit board, comprising:
    a supporting substrate;
    a plurality of light emitting elements mounted to the supporting substrate;
    a through hole passing through the supporting substrate; and
    a connector inserted into the through hole and supplying an electric current to the light emitting elements,
    wherein the through hole is formed at a position corresponding to a position between the light emitting elements, and
    wherein the supporting substrate comprises a first region and a second region extending to be bent from the first region.

2. The circuit board of claim 1, wherein the light emitting elements are mounted to one surface of the first region of the supporting substrate, and the circuit board further comprises a pad portion having pad wirings connected to the light emitting elements on the one surface of the first region; and a string portion having string wirings for transmitting electrical signals to the light emitting elements.

3. The circuit board of claim 2, further comprising a bending hole formed in a bending portion between the first region and the second region.

4. A lighting device, comprising:
    a circuit board of claim 1; and
    an outer housing including an external through hole at a position corresponding to the position of the through hole of the circuit board.

5. A circuit board, comprising:
    a supporting substrate;
    a plurality of light emitting elements mounted to the supporting substrate; and
    a through hole formed in the supporting substrate, and into which a connector for supplying currents to the light emitting elements is inserted,
    wherein the through hole is formed at a position corresponding to a position between the light emitting elements, and
    wherein the supporting substrate comprises a first region and a second region extending to be bent from the first region.

6. The circuit board of claim 5, wherein the light emitting elements are mounted to one surface of the first region, and the circuit board further comprises a pad portion having pad wirings connected to the light emitting elements on the one surface of the first region, and a string portion having string wirings for transmitting electrical signals to the light emitting elements.

7. The circuit board of claim 6, further comprising a bending hole formed in a bending portion between the first region and the second region.

* * * * *